(12) United States Patent
Sim

(10) Patent No.: US 6,806,760 B2
(45) Date of Patent: Oct. 19, 2004

(54) LOW-VOLTAGE BOOSTER CIRCUITS AND METHODS OF OPERATION THEREOF

(75) Inventor: Jae-Yoon Sim, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/385,891

(22) Filed: Mar. 11, 2003

(65) Prior Publication Data

US 2003/0197554 A1 Oct. 23, 2003

(30) Foreign Application Priority Data

Apr. 17, 2002 (KR) .................................. 10-2002-0020888

(51) Int. Cl.[7] .............................. H02M 3/18; G05F 3/16
(52) U.S. Cl. ...................... 327/536; 327/537; 327/543; 307/10; 363/60
(58) Field of Search ................................ 327/536, 537, 327/540, 541, 543, 589; 363/59, 60; 307/110

(56) References Cited

U.S. PATENT DOCUMENTS 6,226,193 B1 * 5/2001 Bayer et al. .................. 363/59
6,563,235 B1 * 5/2003 McIntyre et al. ............ 307/109
6,693,808 B2 * 2/2004 Myono ......................... 363/62

* cited by examiner

*Primary Examiner*—Timothy P. Callahan
*Assistant Examiner*—Terry L. Englund
(74) *Attorney, Agent, or Firm*—Myers Bigel Sibley & Sajovec P.A.

(57) ABSTRACT

A voltage booster circuit includes first and second capacitors and a switch circuit coupled to the first and second capacitors and operative to apply a power supply across the first and second capacitors in series responsive to a first signal to thereby charge the first and second capacitors and to couple the first and second capacitors in parallel between an output terminal and a power supply node of the power supply responsive to deassertion of the first signal and assertion of a second signal to thereby boost a voltage at the output terminal. The first and second signals may be alternately asserted in a succession of time periods, e.g., the first and second signals may be asserted in respective non-overlapping time periods.

8 Claims, 5 Drawing Sheets

(C10=C20)

(C10=C20)

LOW-VOLTAGE BOOSTER CIRCUITS AND METHODS OF OPERATION THEREOF

RELATED APPLICATION

This application claims priority from Korean Patent Application No. 2002-20888, filed on Apr. 17, 2002, the contents of which are herein incorporated by reference in their entirety.

BACKGROUND OF THE INVENTION

The present invention relates to semiconductor integrated circuit devices, and, more particularly, to booster circuits for semiconductor integrated circuit devices.

As lower power consumption has been desired in semiconductor integrated circuit devices, power supply voltage has been increasingly lowered to provide lower power consumption. However, semiconductor memory devices often include circuits that need voltages higher than the power supply voltage. For this reason, booster circuits are often included in semiconductor integrated circuit devices to provide higher voltages.

Referring to FIG. 1, a conventional booster circuit 10 generates a higher voltage than a power supply voltage VCC and comprises switches SW1, SW2, SW3, and SW4 and a capacitor C1. The switches SW1 and SW4 are controlled by a control signal P2, and the switches SW2 and SW3 are controlled by a control signal P1. The control signals P1 and P2 are alternately oscillating signals.

In operation, when the control signal P1 is at a high level and the control signal P2 is at a low level, a node NDA is coupled to a ground node GND through the switch SW3, and a node NDB is coupled to the power supply voltage VCC through the switch SW2. Consequently, the nodes NDA and NDB are charged to the voltage of the ground node GND and the voltage of the power supply node VCC, respectively. When the control signal P1 goes low and the control signal P2 goes high, a voltage of the node NDB is increased from VCC to 2 VCC by the capacitor C1. When the control signal P1 has a low-to-high transition and the control signal P2 has a high-to-low transition, the nodes NDA and NDB are charged to the voltage of the ground node GND and the power supply node VCC, respectively.

In general, efficiency is a ratio of output power to input power. As output power may be determined by subtracting power loss from input power, efficiency (in percentage) may be expressed as (output/(output+loss))*100. Output may indicate an amount of charge that is transferred to a high voltage terminal VP at pumping, while loss may represent the amount of charge that is consumed at charging. Accordingly, pump efficiency of a booster circuit as shown in FIG. 1 may be expressed as follows:

$$\text{Pump efficiency} = \frac{C(2VCC - VP)}{C\{VCC - (VP - VCC)\} + C(2VCC - VP)} \times 100 \quad (1)$$

In Equation (1), "C" is a capacitance value of the capacitor C1. The conventional booster circuit 10 illustrated in FIG. 1 has a pump efficiency of about 50%.

To obtain a boosted voltage using a lower supply voltage using the circuit of FIG. 1, input current to be consumed typically is greater than current to be pumped. Therefore, the pump efficiency of the conventional booster circuit of FIG. 1 is always less than "1." Generally, the higher the pump efficiency, the less input current needed to produce constant output current. Accordingly, it is generally desirable to develop a booster circuit whose pump efficiency is high.

SUMMARY OF THE INVENTION

In some embodiments of the present invention, a voltage booster circuit includes first and second capacitors and a switch circuit coupled to the first and second capacitors. The switch circuit is operative to apply a power supply across the first and second capacitors in series responsive to a first signal to thereby charge the first and second capacitors and to couple the first and second capacitors in parallel between an output terminal and a power supply node of the power supply responsive to deassertion of the first signal and assertion of a second signal to thereby boost a voltage at the output terminal. The first and second signals may be alternately asserted in a succession of time periods, e.g., the first and second signals may be asserted in respective non-overlapping time periods.

In some embodiments, the switch circuit includes a first switch operative to couple and decouple a first terminal of the first capacitor to and from a ground node responsive to the first signal; a second switch operative to couple and decouple the first terminal of the first capacitor to and from a power supply node responsive to the second signal; a third switch operative to couple and decouple a second terminal of the first capacitor to and from the output terminal responsive to the second signal; a fourth switch operative to couple and decouple the second terminal of the first capacitor to and from a first terminal of the second capacitor responsive to the first signal; a fifth switch operative to couple and decouple the first terminal of the second capacitor to and from the power supply node responsive to the second signal; a sixth switch operative to couple and decouple a second terminal of the second capacitor to and from the power supply node responsive to the first signal; and a seventh switch operative to couple and decouple the second terminal of the second capacitor to and from the output terminal responsive to the second signal.

In further embodiments, the booster circuit further includes a third capacitor having a first terminal configured to receive the first signal. The first capacitor has a first terminal configured to receive the second signal. The switch circuit includes: a first transistor having a current path that is coupled between a second terminal of the first capacitor and a first terminal of the second capacitor and that is controlled responsive to the first signal; a second transistor having a current path that is coupled between the second terminal of the first capacitor and the output terminal and that is controlled responsive to the second signal; a third transistor having a current path that is coupled between a second terminal of the second capacitor and the output terminal and that is controlled responsive to the second signal; a fourth transistor having a current path that is coupled between the second terminal of the second capacitor and a power supply node and that is controlled responsive to the first signal; a fifth transistor having a current path that is coupled between a second terminal of the third capacitor and the power supply node and that is controlled responsive to a voltage at the second terminal of the first capacitor; and a sixth transistor having a current path that is coupled between the first terminal of the second capacitor and a second power supply node and that is controlled responsive to a third signal that is a logical complement of the second signal.

In additional embodiments of the present invention, a booster circuit includes first and second capacitors and an output terminal. A first switch circuit couples the first and second capacitors in series between a power supply node and a ground node during a first period to charge the first and second capacitors. A second switch circuit couples the first and second capacitors in parallel between the output terminal and a power supply node during a second period to pump current to the output terminal. The first switch circuit may include: a first switch which is coupled between first terminals of the first and second capacitors; a second switch which is coupled between a second terminal of the first capacitor and a ground node; and a third switch which is coupled between a second terminal of the second capacitor and the power supply node. The first, second and third switches operate responsive to a first signal. The second switch circuit may include: a fourth switch which is coupled between the second terminal of the first capacitor and the power supply node; a fifth switch which is coupled between the one terminal of the first capacitor and the output terminal; a sixth switch which is coupled between the one terminal of the second capacitor and the power supply node; and a seventh switch which is coupled between the other terminal of the second capacitor and the output terminal. The fourth, fifth, sixth and seventh switches are switched on/off by a second oscillating signal.

In still further embodiments, a booster circuit includes a first capacitor that has a first terminal supplied with a first oscillating signal and a second terminal coupled to a first node. A first switch is coupled between the first node and a second node and is controlled by a second oscillating signal. A second capacitor has a first terminal coupled to the second node and a second terminal coupled to a third node. A second switch is coupled between a power supply node and the third node and is controlled by the second oscillating signal. A third switch is coupled between the power supply node and the second node and is controlled by a complementary signal of the first oscillating signal. A fourth switch is coupled between the first node and the output terminal and is controlled by the first oscillating signal. A fifth switch is coupled between the third node and the output terminal and is controlled by the first oscillating signal.

The booster circuit may further include a third capacitor that has a first terminal supplied with the second oscillating signal and a second terminal coupled to a fourth node. A sixth switch is coupled between the power supply node and the fourth node and is controlled by a voltage of the first node. A voltage of the fourth node controls the first and second switches.

DETAILED DESCRIPTION

Figure 1:
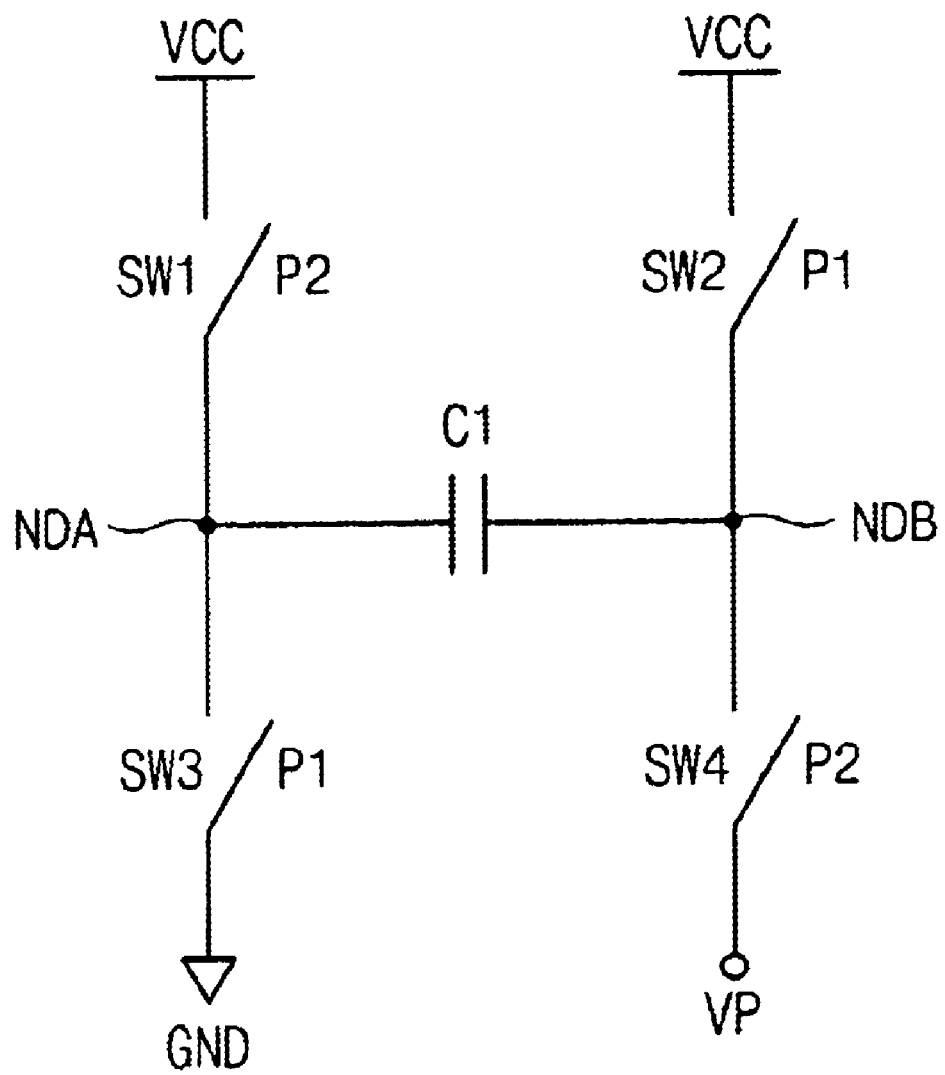
FIG. 1 is a circuit diagram of a conventional booster circuit.

The present invention now will be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals refer to like elements throughout.

Figure 2:
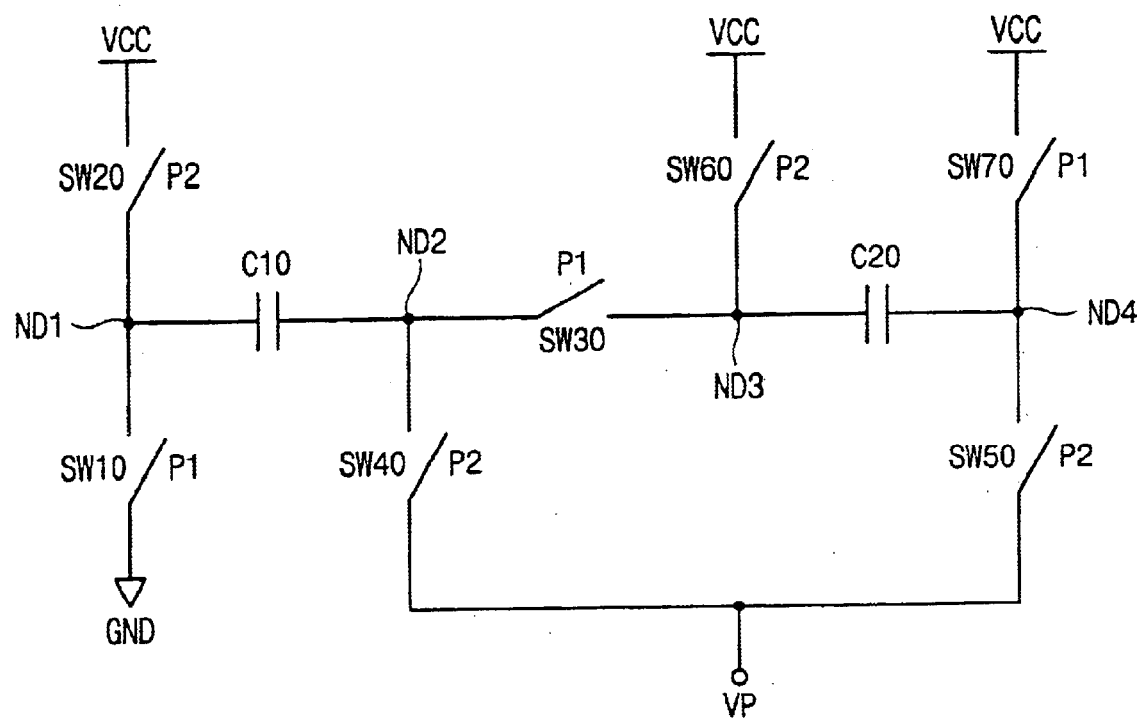
FIG. 2 is a schematic diagram of a booster circuit according to some embodiments of the present invention.
Figure 3:
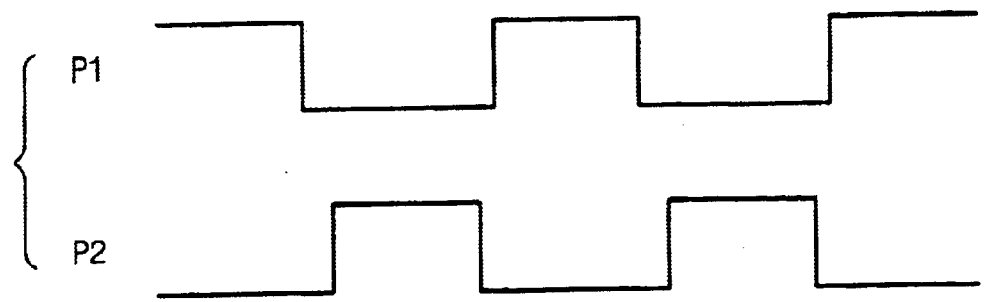
FIG. 3 shows exemplary waveforms of control signals for the circuit of FIG. 2.
Figure 4A:
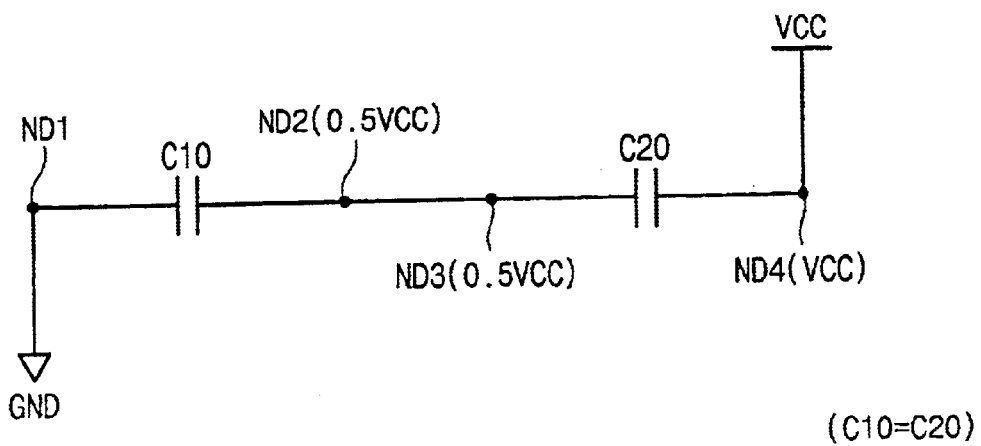
FIG. 4A is a diagram showing voltages of respective nodes of the booster circuit of FIG. 2 in a charge period.
Figure 4B:
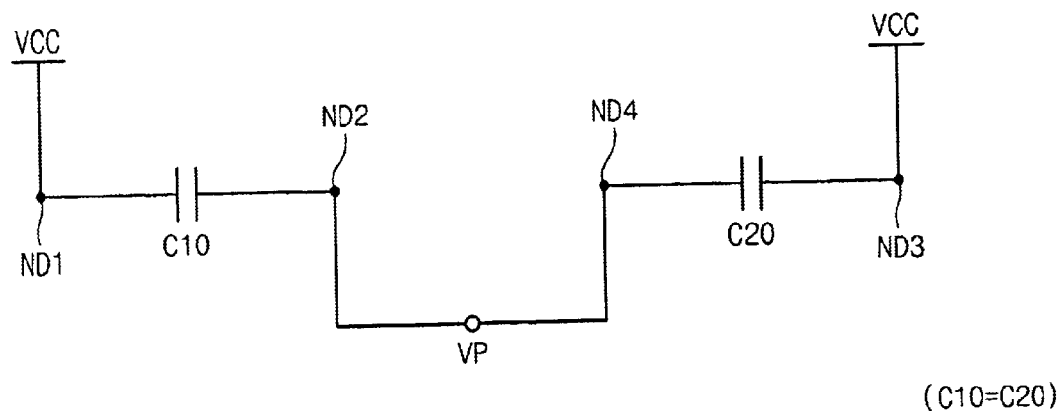
FIG. 4B is a diagram showing voltages of respective nodes of the booster circuit of FIG. 2 in a pump period.
Figure 4C:
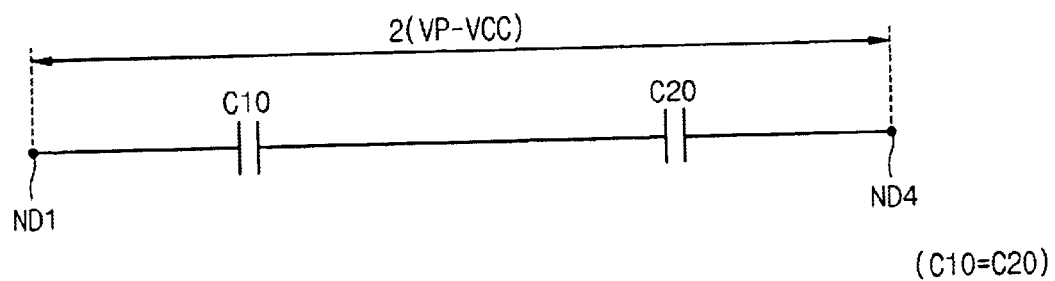
FIG. 4C is a diagram showing voltages of respective nodes of the booster circuit of FIG. 2 before the nodes are charged.

FIG. 2 illustrates a booster circuit 10 according to some embodiments of the present invention. FIG. 3 shows waveforms of control signals of the booster circuit 10 of FIG. 2. FIG. 4A is a diagram showing voltages of respective nodes of the booster circuit in a charge period, FIG. 4B is a diagram showing voltages of respective nodes of the present booster circuit in a pump period, and FIG. 4C is a diagram showing voltages of respective nodes of the present booster circuit before the nodes are charged.

Referring to FIG. 2, in the booster circuit 10, one terminal of a capacitor C10 is coupled to a node ND1, which may be selectively coupled to a ground node GND via a switch SW10 responsive to a control signal P1 and to a power supply node VCC via a switch SW20 responsive to a control signal P2. The other terminal of the capacitor C10 is coupled to a node ND2, which may be selectively coupled to a node ND3 via a switch SW30 responsive to the control signal P1 and to a high voltage terminal VP via a switch SW40 responsive to the control signal P2. The node ND3 may be selectively coupled to the power supply node VCC via a switch SW60 responsive to the control signal P2. A capacitor C20 is coupled between the node ND3 and a node ND4. The node ND4 may be selectively coupled to a high voltage terminal VP via a switch SW50 responsive to the control signal P2 and to the power supply node VCC via a switch SW70 responsive to the control signal P1. Herein, the signals P1 and P2 are oscillating signals having non-overlapping "high" levels, as illustrated in FIG. 3.

For purposes of the following discussion, it is assumed that the capacitor C10 has substantially the same capacitance as the capacitor C20 and that substantially no voltage drop occurs across each of the switches SW10, SW20, SW30, SW40, SW50, SW60, and SW70. When the oscillating signal P1 is at a high level and the signal P2 is at a low level, a charge operation of the booster circuit 10 is performed. In particular, when the oscillating signal P1 is at a high level and the oscillating signal P2 is at a low level, the ND1 node is coupled to the ground node GND via the switch SW10, and the ND4 node is coupled to the power supply node VCC via the switch SW70. At this time, the nodes ND2 and ND3 are electrically coupled each other through the switch SW30. This allows the capacitors C10 and C20 to be coupled in series between the ground node GND and the power supply node VCC. Thus, a total capacitance value of the serially coupled capacitors C10 and C20 becomes about 0.5C (where "C" is a capacitance value of each capacitor). As illustrated in FIG. 4A, the node ND4 is charged to about the voltage of the power supply node VCC, the nodes ND2 and ND3 are charged to about 0.5 VCC, and the node ND1 is charged to the voltage of the ground node GND.

When the oscillating signal P1 goes low and the oscillating signal P2 goes high, the nodes ND2 and ND3 are electrically isolated. The node ND2 is coupled to the high voltage terminal VP via the switch SW40 and the node ND4 is coupled to the high voltage terminal VP via the switch SW50. As the node ND1 is coupled to the power supply node VCC via the switch SW20, a voltage of the node ND2 is boosted from 0.5VCC to 1.5VCC. Likewise, as the node ND3 is coupled to the power supply node VCC via the switch SW60, a voltage of the node ND4 is boosted from 0.5VCC to 1.5VCC. Therefore, charges corresponding to C(1.5VCC-VP) are transferred to the high voltage terminal VP via the switch SW40, and charges corresponding to C(1.5VCC-VP) are transferred to the high voltage terminal VP via the switch SW50. As illustrated in FIG. 4B, a voltage of the high voltage terminal VP may be increased.

After this, when the oscillating signal P1 transitions to a high level and the oscillating signal P2 transitions to a low level, as illustrated in FIG. 4C, the capacitors C10 and C20 are coupled in series, so that a voltage of 2(VP-VCC) is developed across the serially coupled capacitors C10 and C20. As set forth above, the node ND4 is charged with the voltage of the power supply node VCC, the nodes ND2 and ND3 are charged to 0.5 VCC, and the node ND1 goes to the voltage of the ground node GND. The pump efficiency of the booster circuit may be expressed as follows:

$$\text{Pump efficiency} = \frac{C(1.5VCC-VP) + C(1.5VCC-VP)}{2C(1.5VCC-VP) + C(1.5VCC-VP)} \times 100 \quad (2)$$

According to Equation (2), the booster circuit illustrated in FIGS. 2–4C can have a pump efficiency of about 67%. Therefore, less input current may be needed to produce constant output current in comparison to some conventional circuits. The improvement in pump efficiency can be attributed to reduced current needed to perform the charge operation.

Figure 5:
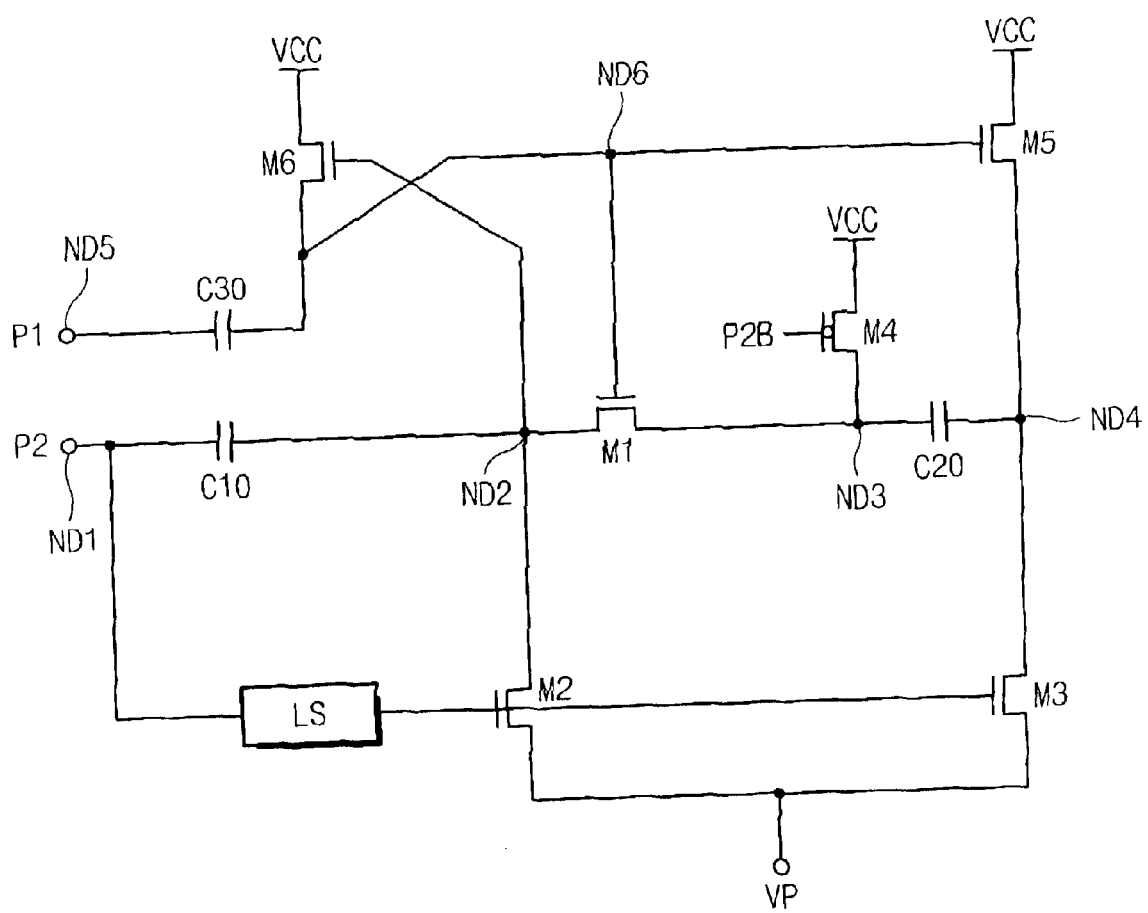
FIG. 5 is a schematic diagram of a booster circuit according to further embodiments of the present invention.

FIG. 5 illustrates a booster circuit 100 according to further embodiments of the present invention. The booster circuit 100 includes three capacitors C10, C20, and C30, five NMOS transistors M1, M2, M3, M5, and M6, a PMOS transistor M4, and a level shifter LS. The capacitor C10 has one terminal coupled to a node ND1 and the other terminal coupled to a node ND2. The node ND1 is supplied with an oscillating signal P2. The NMOS transistor M1, whose gate is coupled to a node ND6 has its current path coupled between the node ND2 and a node ND3. A current path of the NMOS transistor M2 is coupled between the node ND2 and a high voltage terminal VP, and a current path of the NMOS transistor M3 is coupled between a node ND4 and the high voltage terminal VP. The NMOS transistors M2 and M3 are controlled responsive to the oscillating signal P2 applied to the level shifter LS.

The PMOS transistor M4 receives an oscillating signal P2B at its gate and has its current path coupled between a power supply node VCC and the node ND3. The oscillating signals P2 and P2B are substantially complementary signals. The NMOS transistor M5 has its gate coupled to the node ND6 and its current path coupled between the power supply node VCC and the node ND4. The capacitor C30 is coupled between the nodes ND5 and ND6, and an oscillating signal P1 is applied to the node ND5. The NMOS transistor M6 has its gate coupled to the node ND2 and has its current path coupled between the power supply node VCC and the node ND6. In the illustrated embodiments, the capacitor C10 has substantially the same capacitance as the capacitor C20. The booster circuit 100 in FIG. 5 operates in a manner similar to that described above with reference to the circuit of FIG. 2, and further description thereof will, therefore, be omitted.

A booster circuit according to some embodiments of the present invention may be used in a semiconductor integrated circuit memory device to generate a voltage that is higher than the voltage of the power supply node VCC. For example, in a DRAM device, a booster circuit according to embodiments of the present invention may be used to generate a voltage that is applied to a circuit for electrically isolating a memory cell array from a sense amplifier. In particular, if a MOS transistor in the isolation circuit is driven using such a boosted voltage, read and write operations may be more stable than would be the case if a power supply voltage were used.

As set forth above, by coupling two capacitors in series between a power supply node and a ground node during a charge period and then connecting the capacitors in parallel during a pumping period, charge current can be reduced. As a result, advantageous pump efficiency can be achieved.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A voltage booster circuit, comprising:

first and second capacitors;

a switch circuit coupled to the first and second capacitors and operative to apply a power supply across the first and second capacitors in series responsive to a first signal to thereby charge the first and second capacitors and to couple the first and second capacitors in parallel between an output terminal and a power supply node of the power supply responsive to deassertion of the first signal and assertion of a second signal to thereby boost a voltage at the output terminal; and a third capacitor having a first terminal configured to receive the first signal;

wherein the first capacitor has a first terminal configured to receive the second signal; and wherein the switch circuit comprises:

a first transistor having a current path that is coupled between a second terminal of the first capacitor and a first terminal of the second capacitor and that is controlled responsive to the first signal;

a second transistor having a current path that is coupled between the second terminal of the first capacitor and the output terminal and that is controlled responsive to the second signal;

a third transistor having a current path that is coupled between a second terminal of the second capacitor and the output terminal and that is controlled responsive to the second signal;

a fourth transistor having a current path that is coupled between the second terminal of the second capacitor and the power supply node and that is controlled responsive to the first signal;

a fifth transistor having a current path that is coupled between a second terminal of the third capacitor and the power supply node and that is controlled responsive to a voltage at the second terminal of the first capacitor; and a sixth transistor having a current path that is coupled between the first terminal of the second capacitor and the power supply node and that is controlled responsive to a third signal that is a logical complement of the second signal.

2. A voltage booster circuit according to claim 1, wherein the first and second signals are alternately asserted in a succession of time periods.

3. A voltage booster circuit according to claim 2, wherein the first and second signals are asserted in respective non-overlapping time periods.

4. A booster circuit comprising:

a first capacitor that has a first terminal supplied with a first oscillating signal and a second terminal coupled to a first node;

a first switch that is coupled between the first node and a second node and is controlled by a second oscillating signal;

a second capacitor that has a first terminal coupled to the second node and a second terminal coupled to a third node;

a second switch that is coupled between a power supply node and the third node and is controlled by the second oscillating signal;

a third switch that is coupled between the power supply node and the second node and is controlled by a complementary signal of the first oscillating signal;

a fourth switch which is coupled between the first node and an output terminal and is controlled by the first oscillating signal; and a fifth switch that is coupled between the third node and the output terminal and is controlled by the first oscillating signal.

5. The booster circuit according to claim 4, further comprising:

a third capacitor which has a first terminal supplied with the second oscillating signal and a second terminal coupled to a fourth node; and a sixth switch that is coupled between the power supply node and the fourth node and is controlled by a voltage of the first node, wherein a voltage of the fourth node controls the first and second switches.

6. The booster circuit according to claim 5, wherein the first, second, fourth, fifth and sixth switches each comprise an NMOS transistor and the third switch comprises a PMOS transistor.

7. The booster circuit according to claim 6, wherein the oscillating signal applied to the NMOS transistors of the fourth and fifth switches is transferred via a level shifter.

8. The booster circuit according to claim 5, wherein the first and second oscillating signals are non-overlapping signals.

* * * * *